United States Patent [19]

Sugiyama

[11] Patent Number: 5,759,053
[45] Date of Patent: Jun. 2, 1998

[54] CONDUCTOR FOR CONNECTION CIRCUIT METHOD OF MAKING THE SAME AND ELECTRIC CONNECTION DEVICE

[75] Inventor: Norio Sugiyama, Haibara-gun, Japan

[73] Assignee: Yazaki Corporation, Tokyo, Japan

[21] Appl. No.: 708,494

[22] Filed: Sep. 5, 1996

[30] Foreign Application Priority Data

Sep. 6, 1995 [JP] Japan .................................. 7-229288

[51] Int. Cl.⁶ .................................................. H01R 4/60
[52] U.S. Cl. ........................... 439/212; 439/885; 439/949
[58] Field of Search ................................ 439/885, 76.2, 439/212, 949

[56] References Cited

U.S. PATENT DOCUMENTS 4,954,090   9/1990   Shimochi .......................... 439/76.2

FOREIGN PATENT DOCUMENTS 61-295814   12/1986   Japan .
3-284111    12/1991   Japan .
6-57023     8/1994    Japan .

Primary Examiner—J. J. Swann
Assistant Examiner—T. C. Patel
Attorney, Agent, or Firm—Armstrong, Westerman, Hattori, McLeland & Naughton

[57] ABSTRACT

A conductor for a connection circuit includes a first conductor band formed in a linear shape and having a base plate and a connection terminal upright at its end and a second conductor band having a base plate and connection terminal extending through a step-like bending conductor and a connection terminal upright at its end are arranged in parallel. The connection terminals of the first conductor band and the second conductor band are opposite to each other. The relative positions of the first and the second conductor band can be adjusted by setting the length of the step-like bending portion for any optional value. The distance between the first conductor band and the second conductor band can be adjusted by bending the base plate portion of the second conductor band in a U-shape.

4 Claims, 3 Drawing Sheets

CONDUCTOR FOR CONNECTION CIRCUIT METHOD OF MAKING THE SAME AND ELECTRIC CONNECTION DEVICE

BACKGROUND OF THE INVENTION

1. Field of the Invention

The present invention relates to a conductor for a connection circuit which is used for connection or branching of a wire harness mounted in a vehicle; a method of making it; and an electric connection device including the conductor.

2. Description of the Prior Art

A previously known connector directly attached to an electric appliance mounted in a vehicle, as shown in FIG. 4, has a structure in which a plurality of bus bars c and c' are integrally molded in two rows. In this case, male terminals d and d' are connected to the bus bars c and c' so that they are opposite to each other, respectively. In this way, the bus bars c and c' are embedded in two stages.

The bus bar c and bus bar c' are individually punched out from a metallic plate and are insertion-molded to make an electric appliance a.

For this reason, in order to make the bus bars c and c', two metallic molds are required, and in order to make three stage bus bars, three metallic molds are required correspondingly, thus increasing production cost.

On the other hand, J-UM-A-6-57023 discloses a technique as shown in FIGS. 6 and 7 herein in which a key-like branch f, branched from the side of a conductor band e, is bent at a right angle to make a connection terminals g.

The technique of making the connection terminal g from the side of the conductor band e restricts the number of connection terminals and the positions where they are to be formed. For this reason, it is difficult to apply this technique to the bus bars of a common connector directly attached to the electric appliance.

SUMMARY OF THE INVENTION

A first object of the present invention is to provide a reliable conductor for a connection circuit which can save the number of metallic molds for fabrication and can be easily dealt with in integral molding.

A second object of the present invention is to provide a method of making the above conductor.

A third object of the present invention is to provide an electric connection device using the conductor.

In an aspect of the present invention, there is provided a conductor for a connection circuit punched out from a sheet of metallic plate, comprising: a first group of rows of plurality of conductive bands linearly formed, each having a base plate portion, a terminal portion extending therefrom and a connection terminal upright at its end; a second group of rows of plurality of conductor bands each having a step-like bending conductor, each having a base plate portion and a terminal portion extending therefrom through the step-like bending conductor, a connection terminal upright at its end; said first group of plurality of rows of conductor bands and said second group of plurality of rows of conductor bands being in parallel and alternately, whereby the corresponding upright positions of the connection terminals in said first and second groups of conductor bands can be adjusted by bending the base plate portions.

In accordance with another aspect of the present invention, there is provided a method of making a conductor for a connection circuit comprising the steps of: punching out a sheet of metallic plate to form, in parallel and alternately, a first group of rows of plurality of conductive bands linearly formed, each having a base plate portion and a terminal portion extending therefrom, and a second group of rows of plurality of conductor bands each having a step-like bending conductor, each having a base plate portion and a terminal portion extending therefrom through the step-like bending conductor; and bending the terminal portions of said first and said second group of rows of conductor bands to form their connection terminals.

In accordance with the present invention, since a first conductor band having a linear shape and a connection terminal upright at its end and a second conductor band having a connection terminal through a step-like bending conductor and upright at its end are arranged in parallel, the opposite locations of the connection terminals of the first conductor band and the second conductor band can be adjusted by setting the length of the step-like bending portion for any optional value.

The distance between the first conductor band and the second conductor band can be adjusted by bending the base plate portion of the second conductor band in a U-shape.

The above and other objects and features of the present invention will be more apparent from the following description taken in conjunction with the accompanying drawings.

DESCRIPTION OF THE PREFERRED EMBODIMENTS

Figure 1:
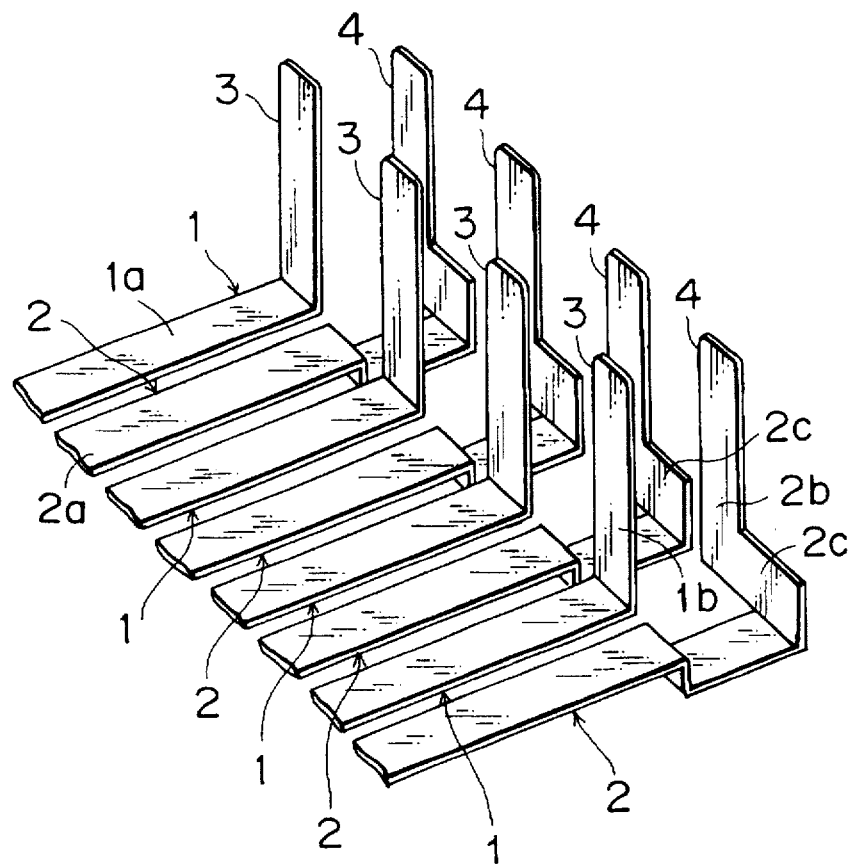
FIG. 1 is a perspective view of a conductor for a connection circuit according to an embodiment of the present invention.

The conductor for a connection circuit according to the present invention is preferably embedded in its base plate in a housing of an electric appliance by "insert molding" to protrude a connection terminal into a directly-attached connector of the housing, or arrange the connection terminal in a molded housing by press-insertion.

Now referring to the drawings, an explanation will be given of several embodiments according to the present invention.

FIG. 1 is a perspective view of a conductor for a connection circuit according to an embodiment of the present invention.

The conductor for a connection circuit, which is formed by punching out a sheet of conductive metallic plate by pressing, includes a plurality of conductor bands 1 and 2 which are arranged in parallel and alternately. At the ends of the conductor bands 1 and 2, the corresponding male connection terminals 3 and 4 are upright. The connection terminals 3 constitute a first group of rows of connection terminals and whereas the connection terminals 4 constitute a second group of rows of connection terminals. The conductor bands 1 and 2, as shown in FIG. 2, are formed as parts of a circuit plate S constituting an electric circuit to be connected to several components.

Figure 2:
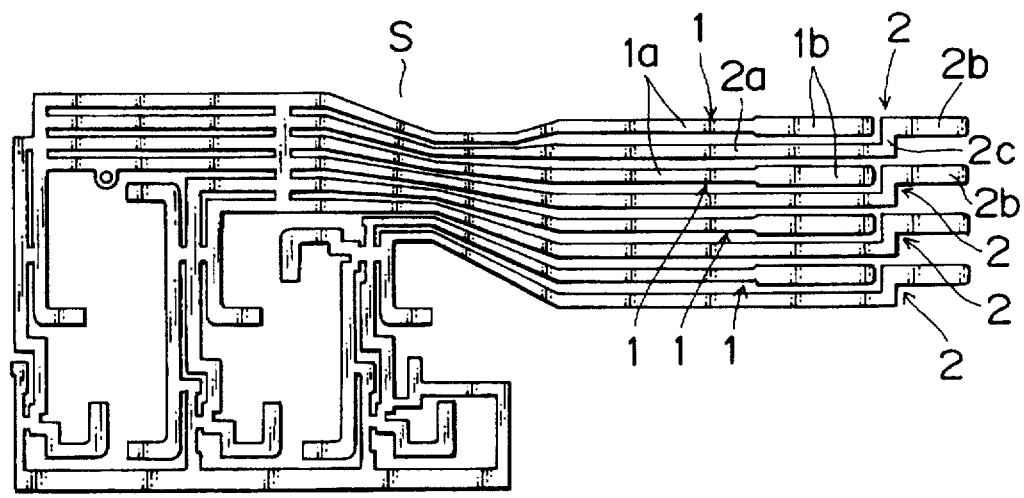
FIG. 2 is a plan view of a circuit board made of a sheet of metallic plate provided with the conductor for a connection circuit of FIG. 1.

As shown in FIG. 2, each conductor band 1 has a terminal portion 1b linearly extending form the base plate portion 1a. Each conductor band 2 has a terminal portion 2b extending from a base plate portion 2a through a step-like offset portion 2c. The terminal portion 2b is longitudinally aligned with the terminal portion 1b.

As shown in FIG. 1, the terminal portions 3, bent at a substantially right angle, constitute the first group of rows of terminal portions and the terminal portions 4, bent at a substantially right angle, constitute the second group of rows of terminal portions and are disposed opposite to the terminal portions of the first group of rows of.

The connection terminals 3 and 4 are arranged to protrude into a housing of a directly-attached connector of an electric appliance and are molded integrally to synthetic resin. Thus, an electrical connection device is provided in which the conductor bands 1 and 2 are embedded in the connector housing.

Figure 3:
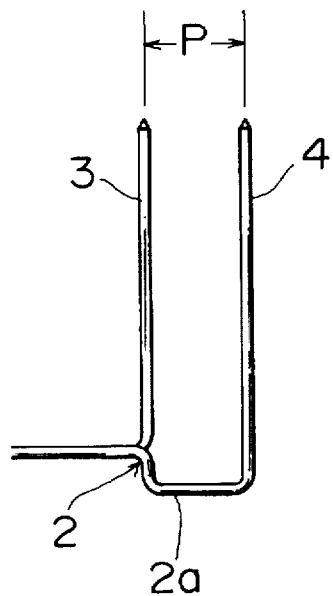
FIG. 3 is a view for explaining the location between opposite connection terminals in FIG. 1.
Figure 4:
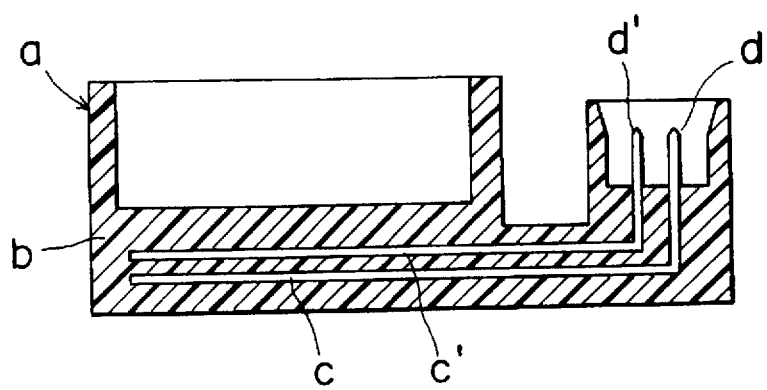
FIG. 4 is a sectional view of bus bars in a directly-attached connector arranged in a conventional electric appliance.
Figure 5:
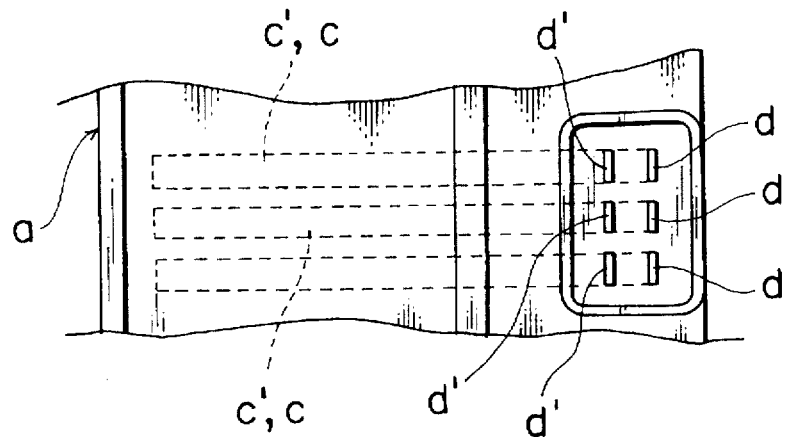
FIG. 5 is a plan view of the directly-attached connector in FIG. 4.
Figure 6:
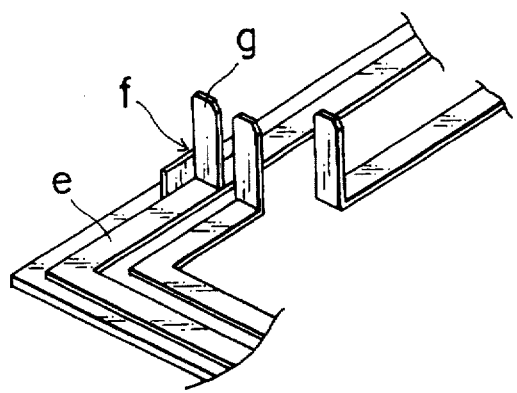
FIG. 6 is a perspective view showing the state where a connection terminal is branched from a conductor band arranged in a conventional electric connection box.
Figure 7:
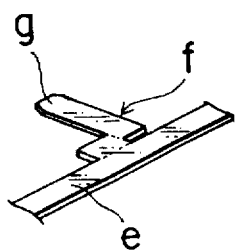
FIG. 7 is a view for explaining the state where the conductor band of FIG. 5 is provided with a branch.

As shown in FIG. 3, the interval P between the connection terminals 3 and 4 can be adjusted by bending the base plate portion 2a downwards in a U-shape. The base plate portion 1a of the conductor band 1 and the base plate portion 2a of the conductor band 2 are substantially coplanar.

Thus, since the above conductor for a connection circuit can be dealt with as a sheet-like component when carrying out insertion molding, its fabrication mold only take into consideration the mutual contact between the adjacent conductor bands 1 and 2. This makes it easier to handle the conductor bands in insertion molding than in the case of insertion molding of bus bars in two stages.

What is claimed is:

1. A conductor for a connection circuit punched out from a sheet of metallic plate comprising:
    a plurality of substantially linearly-formed conductor bands having base plate portions disposed in generally coplanar, side-by-side, parallel disposition, said conductor bands being alternately disposed in two groups including a first group in which each conductor band has a terminal portion longitudinally aligned with, and bent upwardly from, the associated base plate portion, and a second group in which each conductor band is in alternate disposition with conductor bands of said first group and has a terminal portion bent upwardly from its associated base plate portion, said terminal portion of said conductor bands of said second group being connected to its associated base late by a laterally offset step-like bending portion operative to place the terminal portions of the conductor bands of said second group in opposed, longitudinally aligned relation with respect to the terminal portions of the conductor bands of said first group.

2. An electric connection device wherein said conductor for a connection circuit according to claim 1 is arranged in a housing.

3. An electric connection device, wherein said conductor for a connection circuit according to claim 1 is embedded in a housing by integral molding.

4. A method of making a conductor for a connection circuit comprising the steps of:
    providing a sheet of metallic plate,
    punching out from said plate a conductor element containing a plurality of substantially linearly-formed conductor bands having base plate portions and terminal portions disposed in generally coplanar, side-by-side, parallel disposition and arranged in two groups in which conductor bands of a first group are alternately disposed with respect to conductor bands of a second group and each have a terminal portion longitudinally aligned with its associated base plate, and the conductor bands of said second group being longer than the conductor bands of said first group, each conductor band of said second group having its terminal portion substantially longitudinally aligned with the terminal portion of said conductor bands of said first group and being connected to its associated base plate portion by a laterally offset step-like bending portion to place each terminal portion of a conductor band of the second group in longitudinal alignment with a terminal portion of a conductor band of the first group, and
    bending the terminal portions of said first group and said second group substantially perpendicularly with respect to their respective base plate portions to place each terminal portion of the second group in opposed, longitudinally aligned relation with respect to an adjacent terminal portion of the first group.

* * * * *